United States Patent
Sun et al.

(10) Patent No.: US 11,043,515 B2
(45) Date of Patent: Jun. 22, 2021

(54) DISPLAY SUBSTRATE, MANUFACTURING METHOD THEREOF, AND DISPLAY DEVICE

(71) Applicant: BOE TECHNOLOGY GROUP CO., LTD., Beijing (CN)

(72) Inventors: Shuang Sun, Beijing (CN); Kuanjun Peng, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 469 days.

(21) Appl. No.: 15/779,694

(22) PCT Filed: Oct. 27, 2017

(86) PCT No.: PCT/CN2017/108059
§ 371 (c)(1),
(2) Date: May 29, 2018

(87) PCT Pub. No.: WO2018/077239
PCT Pub. Date: May 3, 2018

(65) Prior Publication Data
US 2020/0312892 A1    Oct. 1, 2020

(30) Foreign Application Priority Data

Oct. 31, 2016    (CN) .......................... 201610930682.5

(51) Int. Cl.
*H01L 27/12*      (2006.01)
*H01L 21/027*     (2006.01)
(Continued)

(52) U.S. Cl.
CPC ........ *H01L 27/1288* (2013.01); *H01L 27/127* (2013.01); *H01L 27/1225* (2013.01);
(Continued)

(58) Field of Classification Search
CPC ............. H01L 27/1288; H01L 27/1225; H01L 27/127; H01L 21/0274; H01L 21/266;
(Continued)

(56) References Cited

U.S. PATENT DOCUMENTS 6,005,270 A * 12/1999 Noguchi ........... H01L 27/11526
257/20
8,183,064 B2 * 5/2012 Liu ....................... G09G 3/3225
438/22
(Continued)

FOREIGN PATENT DOCUMENTS

CN        1917155       2/2007
CN        101540332     9/2009
(Continued)

OTHER PUBLICATIONS

International Search Report and Written Opinion from PCT/CN2017/108059 dated Jan. 25, 2018 along with English translation of Written Opinion.
(Continued)

*Primary Examiner* — Vu A Vu
(74) *Attorney, Agent, or Firm* — Calfee, Halter & Griswold LLP (57) ABSTRACT

A display substrate, a manufacturing method thereof, and a display device. The manufacturing method of a display substrate includes: providing a substrate; and forming, on the substrate, a first thin film transistor including a first active layer and a second thin film transistor including a second active layer. The second active layer includes a central area and doped regions located at two sides of the central area, respectively. Forming a first thin film transistor including a first active layer and a second thin film transistor including a second active layer on the substrate includes
(Continued)

forming the first active layer and the doped regions of the second active layer using a single mask.

16 Claims, 6 Drawing Sheets

(51) Int. Cl.
*H01L 21/266* (2006.01)
*H01L 21/467* (2006.01)

(52) U.S. Cl.
CPC ........ *H01L 21/0274* (2013.01); *H01L 21/266* (2013.01); *H01L 21/467* (2013.01)

(58) Field of Classification Search
CPC .............. H01L 21/467; H01L 27/1214; H01L 27/1259
USPC .......................................................... 257/43
See application file for complete search history.

(56) References Cited

U.S. PATENT DOCUMENTS

| | | | | |
|---|---|---|---|---|
| 8,227,808 | B2* | 7/2012 | Wan | H01L 27/1237 257/69 |
| 8,901,650 | B2* | 12/2014 | Makita | H01L 27/1277 257/336 |
| 2007/0040174 | A1 | 7/2007 | Kim et al. | |
| 2009/0230397 | A1 | 9/2009 | Noda et al. | |
| 2010/0308324 | A1 | 12/2010 | Kim et al. | |
| 2017/0162706 | A1 | 6/2017 | Lu | |

FOREIGN PATENT DOCUMENTS

| | | |
|---|---|---|
| CN | 105118807 | 12/2015 |
| CN | 106057826 | 10/2016 |

OTHER PUBLICATIONS

Office action from Chinese Application No. 201610930682.5 dated Feb. 11, 2018.
Office action from Chinese Application No. 201610930682.5 dated Nov. 7, 2017.
Office action from Chinese Application No. 201610930682.5 dated Jul. 13, 2017.

* cited by examiner

DISPLAY SUBSTRATE, MANUFACTURING METHOD THEREOF, AND DISPLAY DEVICE

RELATED APPLICATION

The present application is the U.S. national phase entry of PCT/CN2017/108059, with an international filling date of Oct. 27, 2017, which claims the benefit of Chinese Patent Application No. 201610930682.5, filed on Oct. 31, 2016, the entire disclosure of which is incorporated herein by reference.

TECHNICAL FIELD

The present disclosure relates to the field of display technologies, and particularly to a display substrate, a manufacturing method thereof, and a display device.

BACKGROUND

At present, industries related to display panels are the basis of electronics industry, and their technologies are constantly evolving and innovating. Oxide technology and low-temperature polysilicon technology are widely used due to their own advantages. More specifically, an advantage of a low-temperature polysilicon transistor is having high electron mobility. However, at the same time, the low-temperature polysilicon transistor also has a disadvantage of large leakage current. An advantage of an oxide transistor is having relatively small leakage current. However, the oxide transistor has low electron mobility.

The oxide transistor and the low-temperature polysilicon transistor are both limited in practical applications due to their respective disadvantages. More specifically, the low-temperature polysilicon transistor has too large leakage current and is unapplicable to the display area.

SUMMARY

In an embodiment, there is provided a manufacturing method of a display substrate, comprising: providing a substrate; and forming, on the substrate, a first thin film transistor including a first active layer and a second thin film transistor including a second active layer. The second active layer includes a central area and doped regions located at two sides of the central area, respectively, and forming, on the substrate, a first thin film transistor including a first active layer and a second thin film transistor including a second active layer comprises: forming the first active layer and the doped regions by using a single mask.

In some embodiments, the manufacturing method of a display substrate further comprises forming a first semiconductor pattern prior to forming the first active layer and the doped regions of the second active layer by using a single mask, the doped regions of the second active layer being formed by doping the first semiconductor pattern.

In some embodiments, the doped region includes a first doped region and a second doped region, and the first doped region is located between the second doped region and the central area, and forming the first active layer and the doped regions by using a single mask comprises: performing a first doping process to the first semiconductor pattern to form the second doped region; and performing a second doping process to the first semiconductor pattern including the second doped region to form the first doped region.

In some embodiments, performing a first doping process to the first semiconductor pattern to form the second doped region comprises: forming a second semiconductor thin film, the second semiconductor thin film covering the first semiconductor pattern; forming a photoresist layer on the second semiconductor thin film; exposing and developing the photoresist layer to form a first photoresist pattern and a second photoresist pattern, the first photoresist pattern corresponding to a position where the first active layer is located, the second photoresist pattern corresponding to positions where the central area and the first doped region are located; etching the second semiconductor thin film to form a first active layer and a second semiconductor pattern and expose a portion of the first semiconductor pattern, the second semiconductor pattern corresponding to positions where the central area and the first doped region are located; and doping the portion of the first semiconductor pattern exposed to form the second doped region.

Further, in some embodiments, performing a second doping process to the first semiconductor pattern including the second doped region to form the first doped region comprises: performing an ashing treatment on the second photoresist pattern to form a third photoresist pattern, the third photoresist pattern corresponding to a position where the central area is located, and doping the first semiconductor pattern a second time to form the first doped region.

Further, in some embodiments, the manufacturing method of a display substrate further comprises: after forming the first doped region, removing the third photoresist pattern.

In some embodiments, forming the first active layer and the doped regions of the second active layer by using a single mask comprises: forming a second semiconductor thin film, the second semiconductor thin film covering the first semiconductor pattern; forming a photoresist layer on the second semiconductor thin film; exposing and developing the photoresist layer to form a first photoresist pattern and a second photoresist pattern, the first photoresist pattern corresponding to a position where the first active layer is located, the second photoresist pattern corresponding to a position where the central area is located; etching the second semiconductor thin film to form a first active layer and a second semiconductor pattern and expose a portion of the first semiconductor pattern, the second semiconductor pattern corresponding to a position where the central area is located; doping the portion of the first semiconductor pattern exposed to form the doped region; and removing the first photoresist pattern and the second photoresist pattern.

In some embodiments, the manufacturing method of a display substrate further comprises: after forming the first active layer and the doped regions by using a single mask, forming a first source/drain pattern over the first active layer, and forming a second source/drain pattern over the second doped region; depositing a first insulating layer and a resin layer on the first source/drain pattern and the second source/drain pattern; and performing using a single mask to the first insulating layer and the resin layer to form a first through hole at a position corresponding to the first source/drain pattern in the first insulating layer and the resin layer, and form a second through hole at a position corresponding to the second semiconductor pattern in the first insulating layer and the resin layer to expose the second semiconductor pattern.

In some embodiments, the manufacturing method of a display substrate further comprises: after forming the first through hole and the second through hole, forming a common electrode and removing the second semiconductor pattern by using a single mask.

In some embodiments, forming a common electrode and removing the second semiconductor pattern by using a single mask comprises: depositing a common electrode material on the resin layer, and performing a patterning process to the common electrode material and the second semiconductor pattern on the central area and the first doped region to form the common electrode and remove the second semiconductor pattern.

In some embodiments, the manufacturing method of a display substrate further comprises: after forming the first active layer and the doped regions of the second active layer by using a single mask, forming a first source/drain pattern on the first active layer, and forming a second source/drain pattern on the doped regions; depositing a first insulating layer and a resin layer on the first source/drain pattern and the second source/drain pattern; and performing using a single mask to the first insulating layer and the resin layer to form a first through hole at a position corresponding to the first source/drain pattern in the first insulating layer and the resin layer, and form a second through hole at a position corresponding to the second semiconductor pattern in the first insulating layer and the resin layer to expose the second semiconductor pattern.

In some embodiments, the manufacturing method of a display substrate further comprises: after forming the first through hole and the second through hole, forming a common electrode and removing the second semiconductor pattern by using a single mask.

In some embodiments, forming a common electrode and removing the second semiconductor pattern by using a single mask comprises: depositing a common electrode material on the resin layer, and performing a patterning process to the common electrode material and the second semiconductor pattern on the central area to form the common electrode and remove the second semiconductor pattern.

In some embodiments, the manufacturing method of a display substrate further comprises: prior to forming the first semiconductor pattern, forming a first gate of the first thin film transistor and a second gate of the second thin film transistor on the substrate by using a single mask; and forming a gate insulating layer on the first gate and the second gate, the first semiconductor pattern being formed on the gate insulating layer.

In some embodiments, a material of the first active layer includes a metal oxide, and a material of the second active layer includes polysilicon.

Another embodiment of the present disclosure provides a display substrate comprising: a substrate; and a first thin film transistor and a second thin film transistor on the substrate, the first thin film transistor including a first active layer, and the second thin film transistor including a second active layer. The second active layer includes a central area and doped regions located at two sides of the central area, respectively.

In some embodiments, the first active layer and the doped regions are formed by using a single mask.

In some embodiments, the first active layer is a metal oxide active layer and the second active layer is a polysilicon active layer.

In some embodiments, the doped region includes a first doped region and a second doped region, the first doped region being located between the second doped region and the central area.

In some embodiments, the second thin film transistor further includes a second source/drain pattern, the second source/drain pattern covering the second doped region.

In some embodiments, the second thin film transistor further includes a second source/drain pattern, the second source/drain pattern covering the doped region.

In some embodiments, the display substrate includes a display area and a peripheral area located around the display area, the first thin film transistor being located in the display area, and the second thin film transistor being located in the peripheral area.

A further embodiment of the present disclosure further provides a display device which may comprise the display substrate according to any of the preceding embodiments.

DETAILED DESCRIPTION OF EMBODIMENTS

In order to make those skilled in the art better understand the technical solutions of the disclosure, embodiments of the present disclosure will be further described in detail below in conjunction with the accompanying drawings and specific implementation examples.

In a related process for manufacturing a display substrate including a low-temperature poly silicon transistor and an oxide transistor, transistors of top-gate structure are formed, and the gate is used as a mask for a doped region in the low-temperature polysilicon transistor. However, for a low-temperature polysilicon transistor of bottom-gate structure, there is a need to provide an additional mask, which undoubtedly increases the complexity of the manufacturing process and the manufacturing cost.

According to an embodiment of the disclosure, there is provided a method for manufacturing a display substrate. The method comprises providing a substrate; and forming, on the substrate, a first thin film transistor including a first active layer and a second thin film transistor including a second active layer. The second active layer includes a central area and doped regions located at two sides of the central area, respectively. Moreover, forming a first thin film transistor including a first active layer and a second thin film transistor including a second active layer on the substrate comprises forming the first active layer and the doped regions of the second active layer by using a single mask.

More specifically, referring to FIGS. 1-17, FIGS. 1 to 17 illustrate an example of a method for manufacturing a display substrate according to an embodiment of the disclosure. As shown in FIG. 17, the display substrate may comprise a substrate 1, and a first thin film transistor and a second thin film transistor on the substrate 1. The first thin film transistor includes a first active layer 3, and the second thin film transistor includes a second active layer 6. The second active layer 6 includes a central area 61 and doped regions located at two sides of the central area 61, respectively. The display substrate may be provided with a display area A and a peripheral area B around the display area A. The first thin film transistor is located in the display area A, and the second thin film transistor is located in the peripheral area B. The first active layer 3 may be, for example, a metal oxide active layer. The second active layer 6 may be, for example, a polysilicon active layer.

An example of the method for manufacturing a display substrate according to an embodiment of the present disclosure may comprise the following steps.

Figure 1:
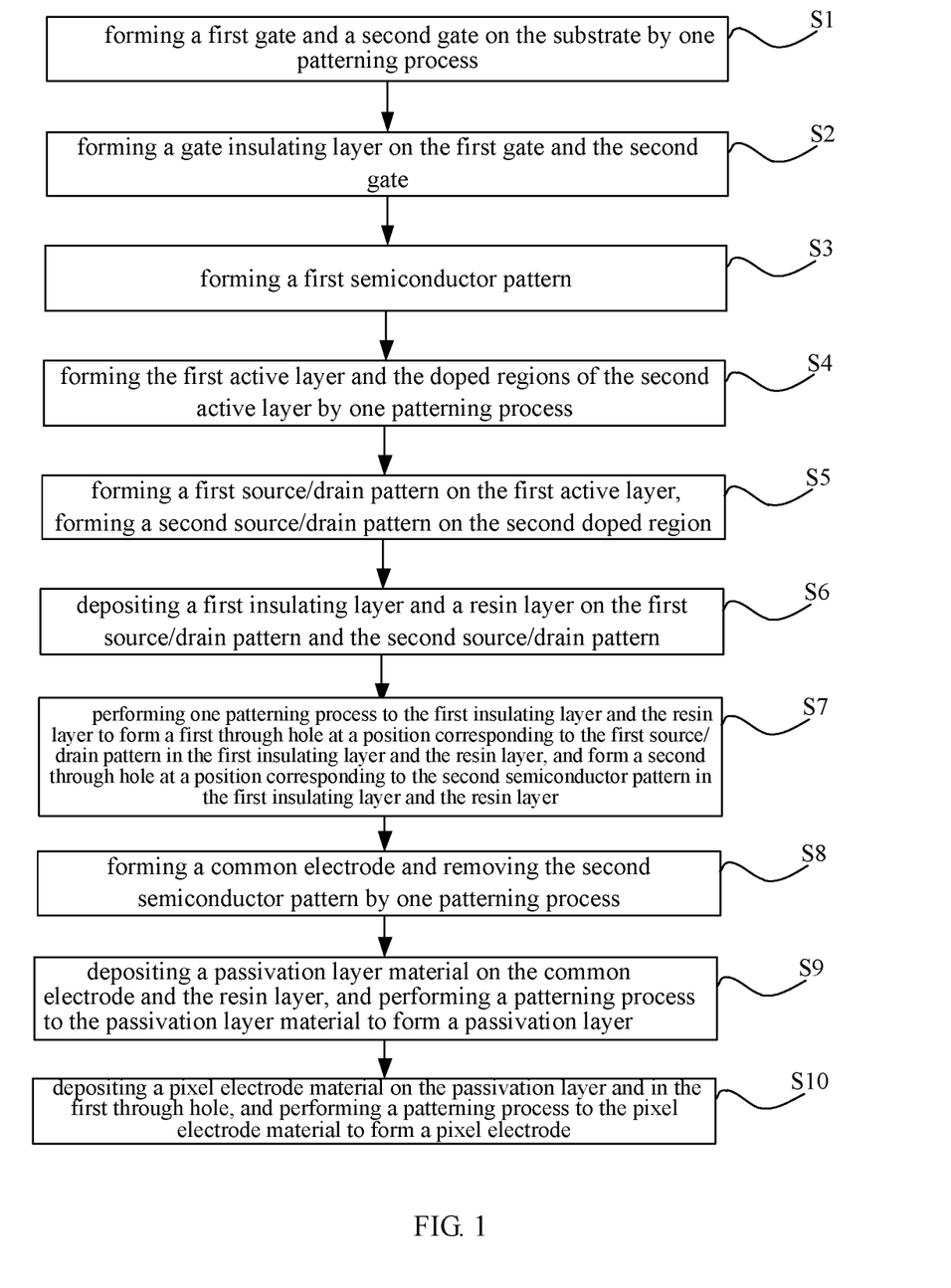
FIG. 1 is a schematic flow chart illustrating a manufacturing method of a display substrate according to an embodiment of the present disclosure.
Figure 2:
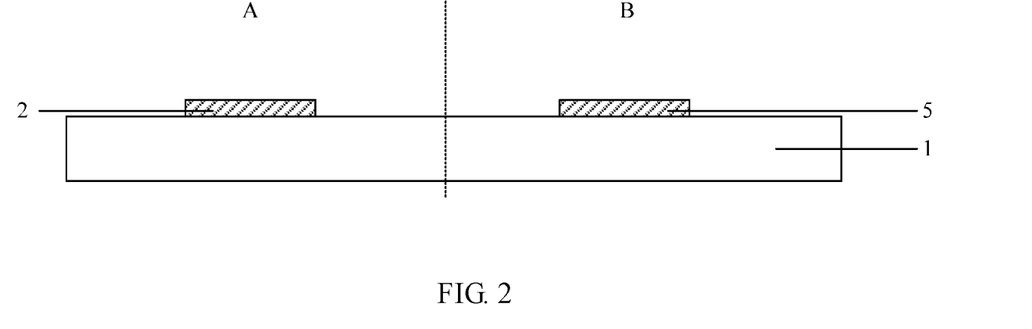
FIG. 2 is a schematic structural diagram illustrating step S1 in a manufacturing method according to an embodiment of the present disclosure.

Referring to FIG. 2, in step S1, a first gate 2 and a second gate 5 are formed on the substrate 1 by using a single mask. The first gate 2 is located in the display area A, and the second gate 5 is located in the peripheral area B.

It is to be noted that "using a single mask" referred to in the embodiment of the disclosure means that only one mask plate is used to expose and develop the photoresist, and a corresponding pattern is formed by etching.

Figure 3:
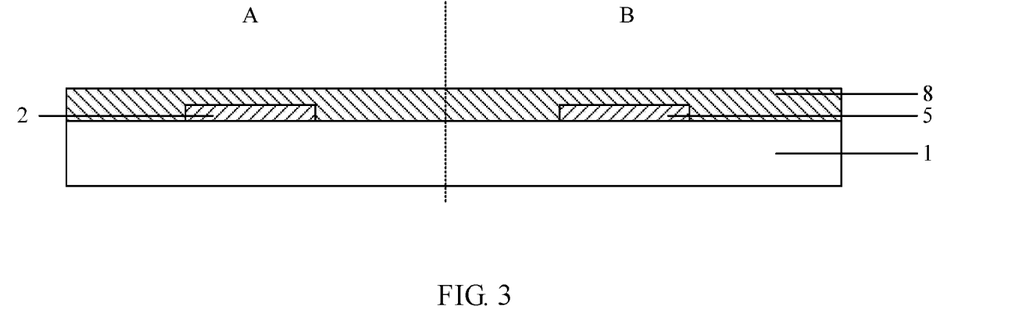
FIG. 3 is a schematic structural diagram illustrating step S2 in a manufacturing method according to an embodiment of the present disclosure.

Referring to FIG. 3, in step S2, a gate insulating layer 8 is formed on the first gate 2 and the second gate 5.

Figure 4:
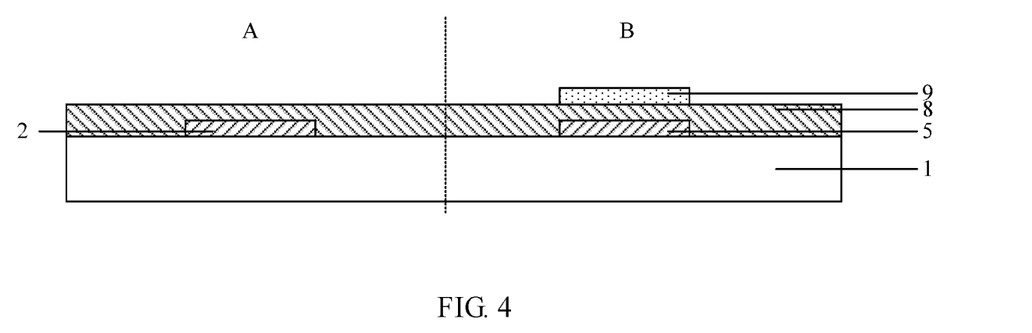
FIG. 4 is a schematic structural diagram illustrating step S3 in a manufacturing method according to an embodiment of the present disclosure.

Referring to FIG. 4, in step S3, a first semiconductor pattern 9 is formed.

As shown in FIG. 4, the first semiconductor pattern 9 is located on the gate insulating layer 8. It can be understood that step S3 may comprise, for example, the steps of: depositing an amorphous silicon material layer on the gate insulating layer 8; performing a dehydrogenation process and an excimer laser annealing process to the amorphous silicon material layer to form a low-temperature polysilicon material layer; depositing a photoresist layer on the low-temperature polysilicon material layer; performing exposure and development processes to the photoresist layer; performing an etching process to an exposed low-temperature polysilicon material layer; and removing the photoresist layer that remains at the position corresponding to the second gate 5 to form the first semiconductor pattern 9.

In step S4, the first active layer of the first thin film transistor and the doped regions of the second active layer of the second thin film transistor are formed by using a single mask. The doped regions of the second active layer may include a first doped region and a second doped region. The first doped region is located between the second doped region and the central area. The doped regions of the second active layer are formed by doping the first semiconductor pattern 9. Therefore, forming the first active layer and the doped regions by using a single mask may comprise: performing a first doping process to the first semiconductor pattern to form the second doped region; performing a second doping process to the first semiconductor pattern that includes the second doped region to form the first doped region.

For example, step S4 may specifically include the following steps.

Figure 5:
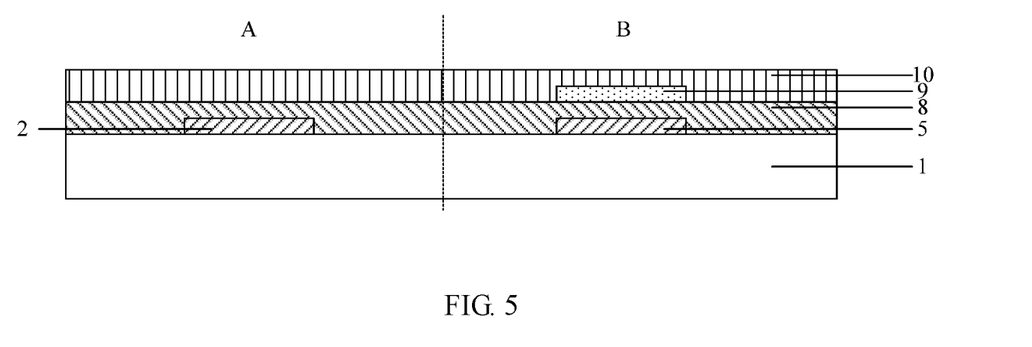
FIG. 5 is a schematic structural diagram illustrating step S41 in a manufacturing method according to an embodiment of the present disclosure.

In step S41, referring to FIG. 5, a second semiconductor thin film 10 is formed. The second semiconductor thin film 10 covers the first semiconductor pattern 9. As shown in FIG. 5, the second semiconductor thin film 10 covers the gate insulating layer 8 and the first semiconductor pattern 9 on the gate insulating layer 8, and the second active layer 6 may be formed based on the first semiconductor pattern.

In step S42, a photoresist layer is formed on the second semiconductor thin film 10.

Figure 6:
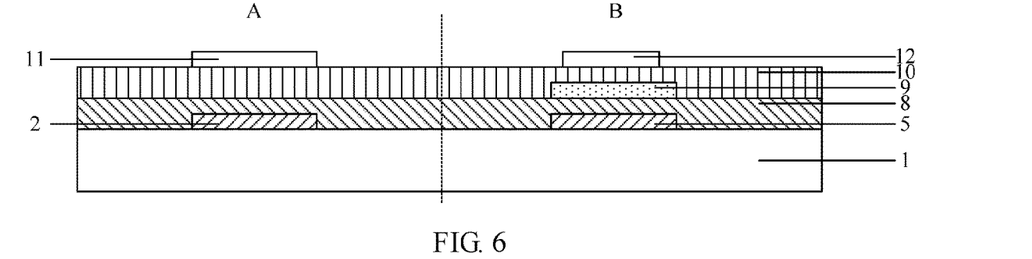
FIG. 6 is a schematic structural diagram illustrating step S43 in a manufacturing method according to an embodiment of the present disclosure.

In step S43, referring to FIG. 6, the photoresist layer is exposed and developed to form a first photoresist pattern 11 and a second photoresist pattern 12. The first photoresist pattern 11 corresponds to a position where the first active layer is located, and the second photoresist pattern 12 corresponds to positions where the central area and the first doped region are located.

As shown in FIG. 6, a portion of the second semiconductor thin film 10 is exposed after the photoresist layer is developed. The first photoresist pattern 11 is located in the display area A, and the second photoresist pattern 12 is located in the peripheral area B. An orthographic projection of the second photoresist pattern 12 on the substrate 1 lies within an orthographic projection of the first semiconductor pattern 9 on the substrate 1.

Figure 7:
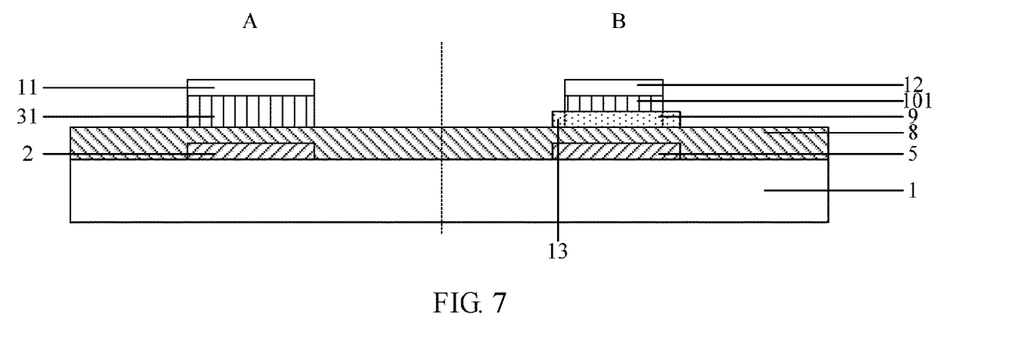
FIG. 7 is a schematic structural diagram illustrating step S44 in a manufacturing method according to an embodiment of the present disclosure.

In step S44, referring to FIG. 7, the second semiconductor thin film 10 is etched to form a first active layer pattern 31 and a second semiconductor pattern 101, and expose a portion of the first semiconductor pattern 9. The second semiconductor pattern 101 corresponds to positions where the central area and the first doped region are located.

As shown in FIG. 7, the exposed second semiconductor thin film 10 is etched. Since the projection of the second photoresist pattern 12 on the substrate 1 lies within the projection of the first semiconductor pattern 9 on the substrate 1, the edge portion of the first semiconductor pattern 9 is exposed. The edge portion of the first semiconductor pattern 9 can be regarded as a first to-be-doped region 13.

Figure 8:
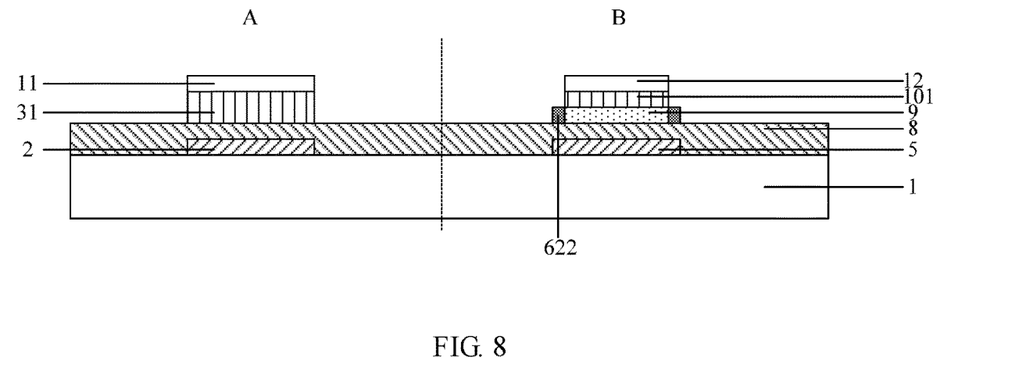
FIG. 8 is a schematic structural diagram illustrating step S45 in a manufacturing method according to an embodiment of the present disclosure.

In step S45, referring to FIG. 8, the exposed portion of the first semiconductor pattern 9 is doped to form a second doped region 622. As shown in FIG. 8, the exposed portion of the first semiconductor pattern 9 (i.e., the first to-be-doped region 13) may be heavily doped to form the second doped region 622.

Figure 9:
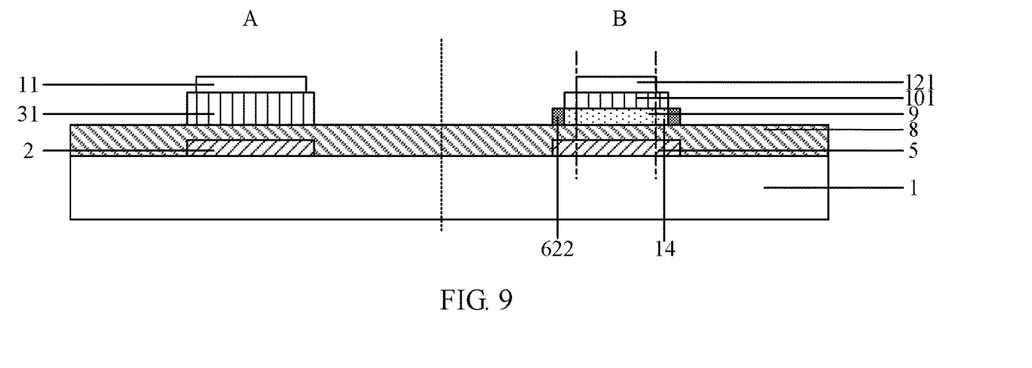
FIG. 9 is a schematic structural diagram illustrating step S46 in a manufacturing method according to an embodiment of the present disclosure.

In step S46, the second photoresist pattern 12 is subjected to an ashing treatment to form a third photoresist pattern 121. The third photoresist pattern 121 corresponds to a position where the central area is located.

As shown in FIG. 9, the second photoresist pattern 12 is subjected to an ashing treatment so as to reduce the coverage area of the second photoresist pattern 12, thereby forming a third photoresist pattern 121. An orthographic projection of the third photoresist pattern 121 on the substrate 1 lies within an orthographic projection of the doped region on the substrate 1. The orthographic projection of the doped region on the substrate 1 includes an orthographic projection of the second doped region 622 on the substrate 1 and an orthographic projection of a second to-be-doped region 14 of the first semiconductor pattern 9 on the substrate 1.

Figure 10:
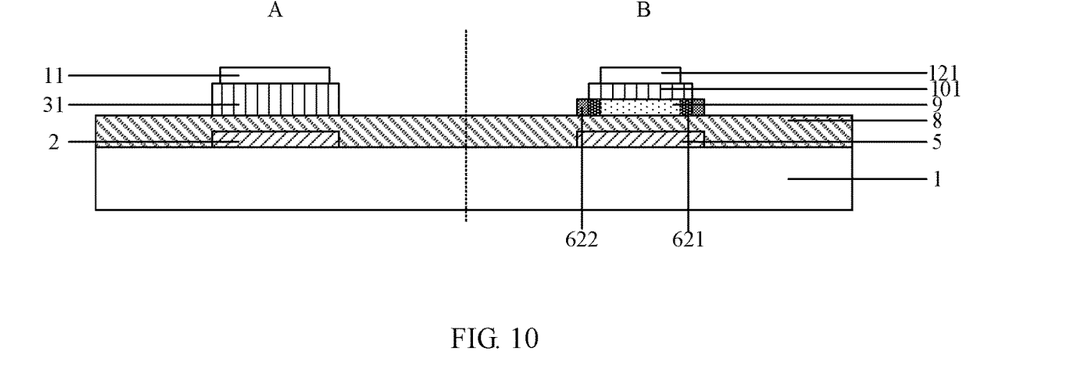
FIG. 10 is a schematic structural diagram illustrating step S47 in a manufacturing method according to an embodiment of the present disclosure.

In step S47, referring to FIG. 10, the first semiconductor pattern 9 is doped a second time to form a first doped region 621. As shown in FIG. 10, the second to-be-doped region 14 may be lightly doped to form the first doped region 621. It can be understood that the doped region of the second active layer includes the first doped region 621 and the second doped region 622.

Figure 11:
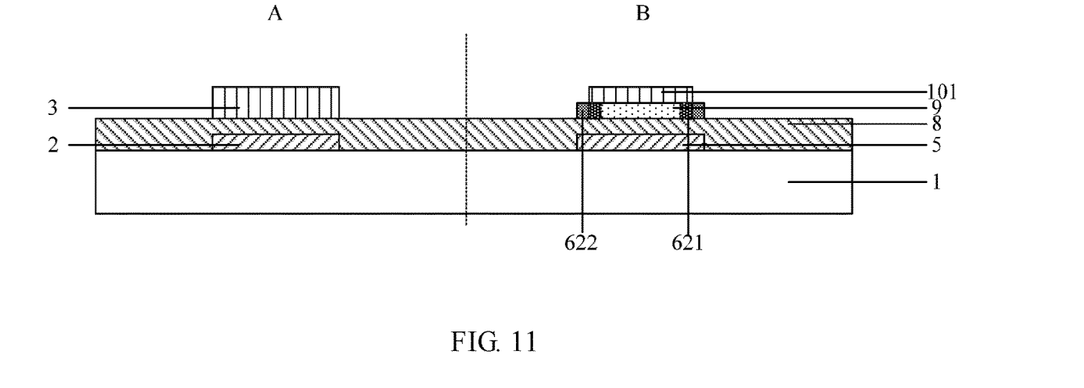
FIG. 11 is a schematic structural diagram illustrating step S48 in a manufacturing method according to an embodiment of the present disclosure.

In step S48, referring to FIG. 11, the first photoresist pattern 11 and the third photoresist pattern 121 are removed. As shown in FIG. 11, the first photoresist pattern 11 and the third photoresist pattern 121 are removed to form the first active layer 3 and expose the second semiconductor pattern 101 on the first semiconductor pattern 9. It can be understood that the first photoresist pattern 11 and the third photoresist pattern 121 may not be removed simultaneously, for example, the first photoresist pattern 11 may be removed before step S48.

The first active layer 3 is made of, for example, indium gallium zinc oxide (IGZO). Of course, the material of the first active layer 3 is not limited thereto. Other types of materials may also be used to form the first active layer 3, which will not be described here.

Figure 12:
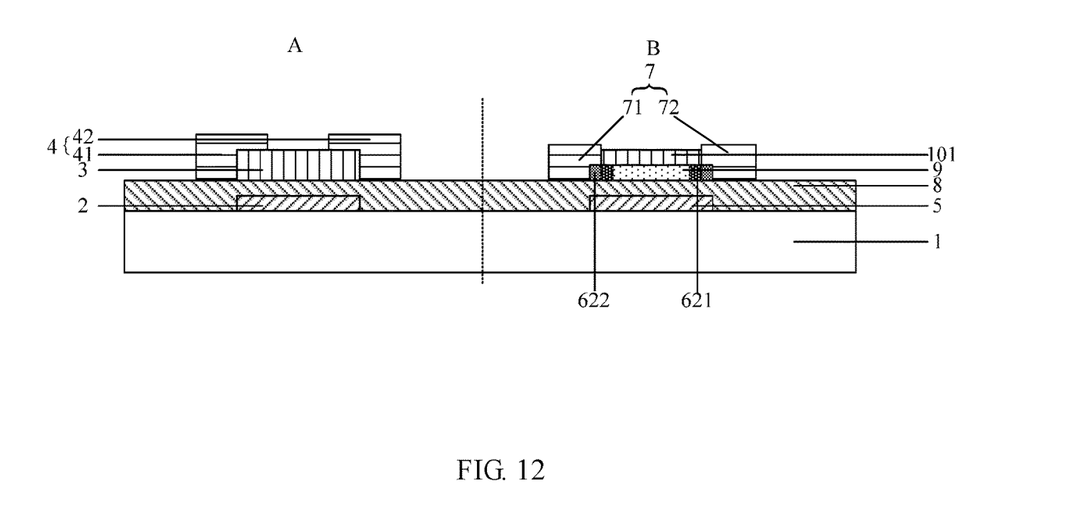
FIG. 12 is a schematic structural diagram illustrating step S5 in a manufacturing method according to an embodiment of the present disclosure.

In step S5, referring to FIG. 12, a first source/drain pattern 4 is formed on the first active layer 3, and a second source/drain pattern 7 is formed on the second doped region 622.

As shown in FIG. 12, the first source/drain pattern 4 includes a first source 41 and a first drain 42. Part of the first source 41 is located on the first active layer 3, and part of the first drain 42 is located on the first active layer 3. The second source/drain pattern 7 includes a second source 71 and a second drain 72. Part of the second source 71 is located on the second doped region 622, and part of the second drain 72 is located on the second doped region 622. It is to be noted that, since the first semiconductor pattern 9 is further covered with the second semiconductor pattern 101, the second semiconductor pattern 101 can prevent the first semiconductor pattern 9 from contacting the etching material for forming the first source/drain pattern 4 and the second source/drain pattern 7, so that the first semiconductor pattern 9 can be protected when the source and the drain are being formed by etching.

Figure 13:
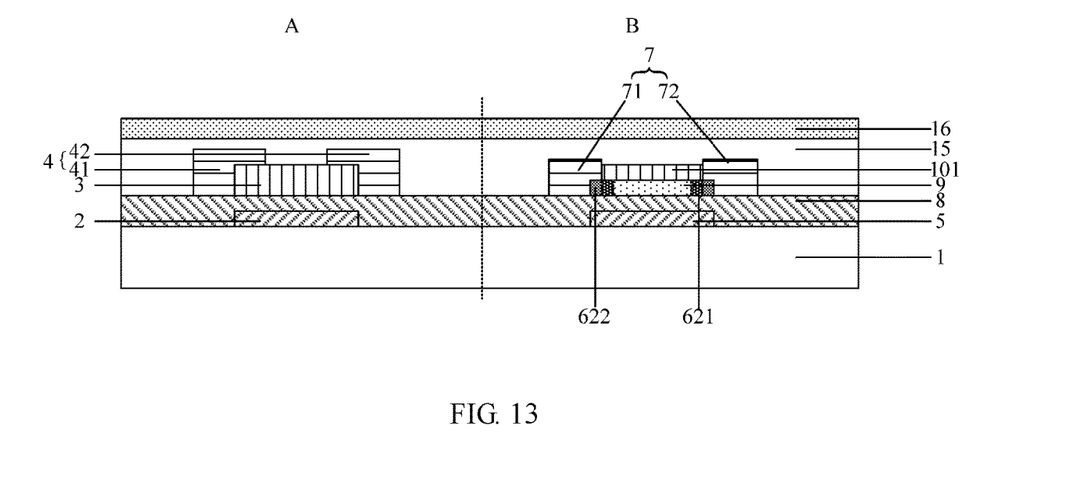
FIG. 13 is a schematic structural diagram illustrating step S6 in a manufacturing method according to an embodiment of the present disclosure.

In step S6, referring to FIG. 13, a first insulating layer 15 and a resin layer 16 are deposited on the first source/drain pattern 4 and the second source/drain pattern 7. The first insulating layer 15 may be, for example, an interlayer dielectric layer.

Figure 14:
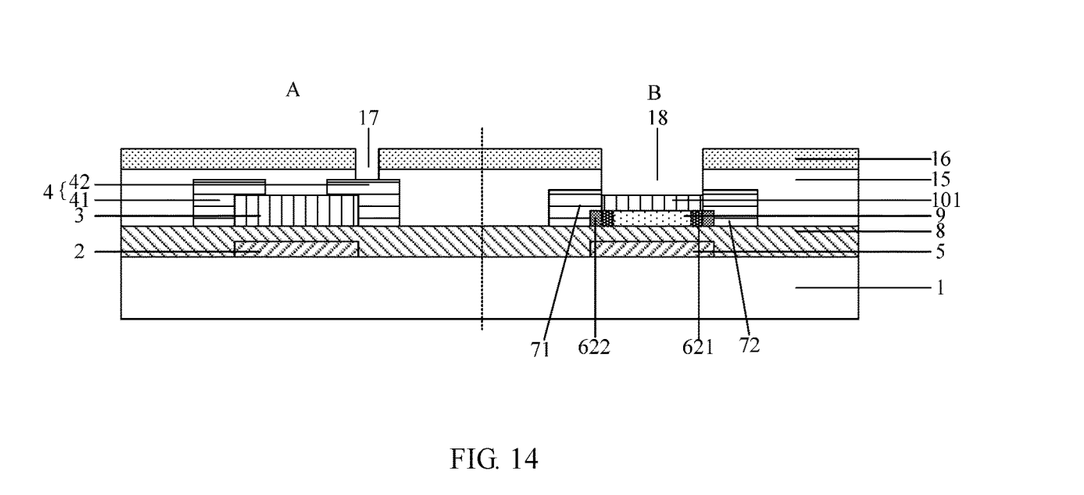
FIG. 14 is a schematic structural diagram illustrating step S7 in a manufacturing method according to an embodiment of the present disclosure.

In step S7, referring to FIG. 14, using a single mask is performed to the first insulating layer 15 and the resin layer 16, to form a first through hole at a position corresponding to the first source/drain pattern 4 in the first insulating layer 15 and the resin layer 16, and form a second through hole 18 at a position corresponding to the second semiconductor pattern 101 in the first insulating layer 15 and the resin layer 16, thereby exposing the second semiconductor pattern 101.

As shown in FIG. 14, it can be understood that performing using a single mask to the first insulating layer 15 and the resin layer 16 may comprise: depositing a photoresist layer on the resin layer 16; exposing and developing the photoresist layer using a mask plate; then etching the first insulating layer 15 and the resin layer 16 to form the first through hole 17 and the second through hole 18 in the first insulating layer 15 and the resin layer 16. The first through hole 17 exposes part of the first drain 42, and the second through hole 18 exposes the second semiconductor pattern 101 on the first semiconductor pattern 9.

Figure 15:
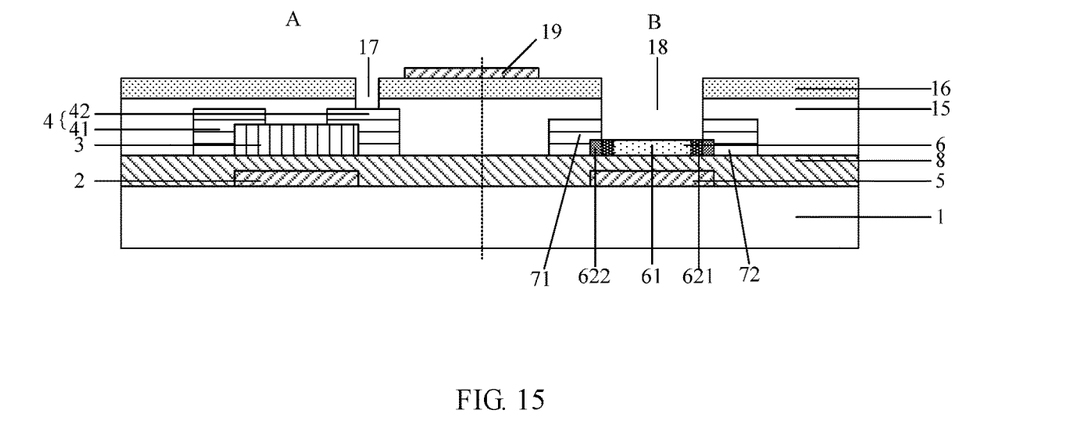
FIG. 15 is a schematic structural diagram illustrating step S8 in a manufacturing method according to an embodiment of the present disclosure.

In step S8, referring to FIG. 15, a common electrode 19 is formed and the second semiconductor pattern 101 is removed by using a single mask.

For example, step S8 may comprise: depositing a common electrode material (e.g., ITO) on the resin layer 16, and performing a patterning process to the common electrode material and the second semiconductor pattern 101 on the central area 61 and the first doped region 621, to form the common electrode 19 and remove the second semiconductor pattern 101.

Referring to FIG. 15, when the common electrode material is being etched, the second semiconductor pattern 101 on the central area 61 and the first doped region 621 of the second active layer may also be etched away to form the common electrode 19 and expose the central area 61 and the first doped region 621 of the second active layer 6. It is to be noted that, the common electrode and the second semiconductor pattern 101 may be made of the same type of material (e.g., metal oxide), or may be made of different materials. The common electrode material and the second semiconductor pattern can be etched away simultaneously by selection of the etching material.

Figure 16:
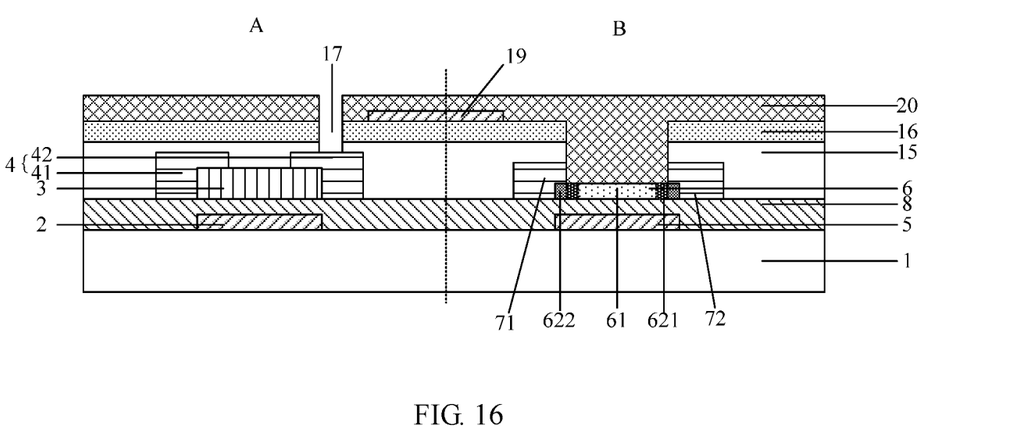
FIG. 16 is a schematic structural diagram illustrating step S9 in a manufacturing method according to an embodiment of the present disclosure.
Figure 17:
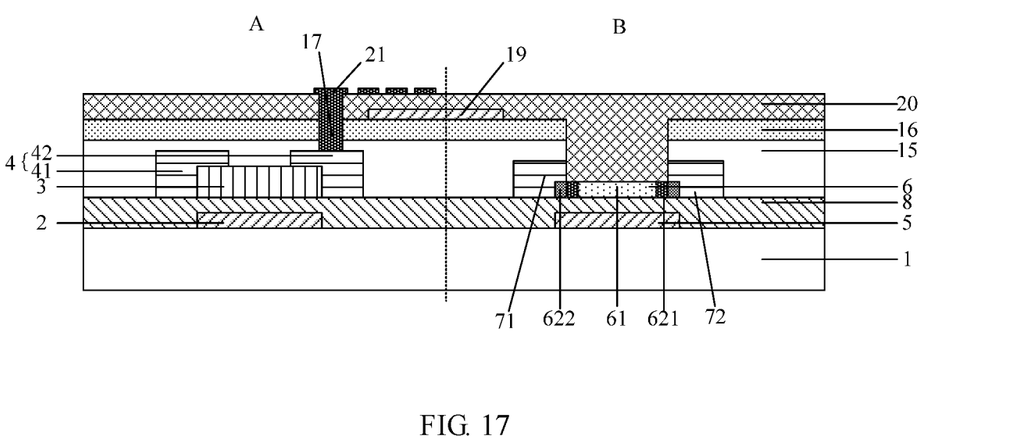
FIG. 17 is a schematic structural diagram illustrating step S10 in a manufacturing method according to an embodiment of the present disclosure.

In step S9, referring to FIG. 16, a passivation layer material is deposited on the common electrode 19 and the resin layer 16, and the passivation layer material is subjected to a patterning process to form a passivation layer 20. The first through hole is disposed in the passivation layer 20.

In step S10, referring to FIG. 17, a pixel electrode material is deposited on the passivation layer 20 and in the first through hole 17, and the pixel electrode material is subjected to a patterning process to form a pixel electrode 21. As shown in FIG. 17, the pixel electrode 21 is located on the passivation layer 20 and in the first through hole 17 to be connected to the first drain 42 via the first through hole 17.

In the method for manufacturing a display substrate according to this embodiment, the first active layer 3 and the doped regions of the second active layer 6 are formed by using a single mask. The second semiconductor pattern 101 on the second active layer 6, on the one hand, can serve as a mask plate for forming the doped regions of the second active layer 6, and on the other hand, can prevent the etching material from contacting the second active layer 6 when the second source/drain pattern 7 is being formed. The second semiconductor pattern 101 on the second active layer 6 may be removed at the time of forming the common electrode 19, thereby reducing the process complexity and the manufacturing cost.

According to another embodiment of the disclosure, there is provided a display substrate. For example, as shown in FIG. 17, the display substrate comprises a substrate 1, and a first thin film transistor and a second thin film transistor on the substrate 1. The first thin film transistor includes a first active layer 3, and the second thin film transistor includes a second active layer 6. The second active layer 6 includes a central area 61 and doped regions located at two sides of the central area 61, respectively. The first thin film transistor and the second thin film transistor may both be bottom-gate thin film transistors. Of course, both the first thin film transistor and the second thin film transistor may also be top-gate thin film transistors. Alternatively, one of the first thin film transistor and the second thin film transistor is a top-gate thin film transistor, and the other is a bottom-gate thin film transistor.

The first active layer 3 and the doped regions of the second active layer 6 may be formed by using a single mask. The first active layer 3 may be a metal oxide active layer, and the second active layer 6 may be a polysilicon active layer.

The doped regions may include a first doped region 621 and a second doped region 622. The first doped region 621 is located between the second doped region 622 and the central area 61.

The second thin film transistor further includes a second source/drain pattern 7, and the second source/drain pattern 7 covers the second doped region 622.

The display substrate may be provided with a display area A and a peripheral area B around the display area A. The first thin film transistor is located in the display area A, and the second thin film transistor is located in the peripheral area B.

The display substrate according to this embodiment may be manufactured using the method for manufacturing a display substrate described above, which will not be described here.

According to a further embodiment of the present disclosure, there is provided another method for manufacturing a display substrate. The difference between this method and the method for manufacturing a display substrate as provided by the above embodiment is that the doped region of the second thin film transistor does not include a first doped region and a second doped region, but only includes one type of doped region. Accordingly, steps S4 and S5 for this further method for manufacturing a display substrate are different.

Specifically, step S4 may comprise the following steps.

In step S41, a second semiconductor thin film is formed, and the second semiconductor thin film covers the first semiconductor pattern.

In step S42, a photoresist layer is formed on the second semiconductor thin film.

In step S43, the photoresist layer is exposed and developed to form a first photoresist pattern and a second photoresist pattern. The first photoresist pattern corresponds to a position where the first active layer is located, and the second photoresist pattern corresponds to a position where the central area is located.

In step S44, the second semiconductor thin film is etched to form a first active layer pattern and a second semiconductor pattern, and expose a portion of the first semiconductor pattern. The second semiconductor pattern corresponds to a position where the central area is located.

In step S45, the exposed portion of the first semiconductor pattern is doped to form a doped region.

In step S46, the first photoresist pattern and the second photoresist pattern are removed.

It can be seen that, in step S4 of this method for manufacturing a display substrate, since it is not necessary to form two types of doped regions (the first doped region and the second doped region), there is no need to perform ashing to the second photoresist pattern, and there is no need to dope the first semiconductor pattern a second time. That is, the doped region is formed only by performing doping once.

Regarding step S5, it may specifically comprise forming a first source/drain pattern on the first active layer, and forming a second source/drain pattern on the doped region.

That is, in comparison with step S5 in the method for manufacturing a display substrate described previously, the second source/drain pattern is formed on the doped region instead of being formed on the second doped region.

For other steps, reference may be made to the method for manufacturing a display substrate described previously, which will not be described here.

In the method for manufacturing a display substrate according to this embodiment, the first active layer and the doped region of the second active layer are formed by using a single mask. The second semiconductor pattern on the second active layer, on the one hand, can serve as a mask plate for forming the doped region of the second active layer, and on the other hand, can prevent the etching material from contacting the second active layer when the second source/drain pattern is being formed. The second semiconductor pattern on the second active layer may be removed at the time of forming the common electrode, thereby reducing the process complexity and the manufacturing cost.

According to yet another embodiment of the present disclosure, there is provided a display substrate having a similar structure to the display substrate described previously except that the doped region of the second thin film transistor does not include a first doped region and a second doped region, but only includes one type of doped region. Therefore, the second source/drain pattern included by the second thin film transistor covers the doped region instead of covering the second doped region.

The display substrate according to this embodiment may be manufactured using the above-mentioned further method for manufacturing a display substrate, which will not be described here.

According to still another embodiment of the present disclosure, there is provided a display panel. The display panel may comprise the above display substrate. It can be understood that the display panel according to this embodiment may further comprise a counter substrate opposite to the display substrate.

According to still another embodiment of the present disclosure, there is provided a display device. The display device may comprise the above display substrate. The display device may be any product or component having a display function such as a display panel, an electronic paper, a mobile phone, a tablet computer, a television, a monitor, a notebook computer, a digital photo frame, a navigator, and the like.

It can be understood that what have been described above are merely exemplary embodiments used for illustrating the principle of the disclosure, but the disclosure is not so limited. Various variations and modifications can be made by those ordinarily skilled in the art without departing from the spirit and essence of the disclosure. These variations and modifications are also regarded as being encompassed within the scope of the disclosure.

The invention claimed is:

1. A manufacturing method of a display substrate, comprising:
   providing a substrate; and
   forming, on the substrate, a first thin film transistor including a first active layer and a second thin film transistor including a second active layer,
   wherein the second active layer includes a central area and doped regions located at two sides of the central area, respectively, and wherein the forming, on the substrate, of the first thin film transistor including the first active layer and the second thin film transistor including the second active layer comprises:
    forming a first semiconductor pattern on the substrate, and
    forming the first active layer and the doped regions using a single mask,
wherein the doped regions include a first doped region and a second doped region, and the first doped region is located between the second doped region and the central area, wherein the doped regions of the second active layer are formed by doping the first semiconductor pattern,
wherein the forming the first active layer and the doped regions using the single mask comprises:
    performing a first doping process to the first semiconductor pattern to form the second doped region, and
    performing a second doping process to the first semiconductor pattern including the second doped region to form the first doped region,
wherein the performing the first doping process to the first semiconductor pattern to form the second doped region comprises:
    forming a second semiconductor thin film, the second semiconductor thin film covering the first semiconductor pattern,
    forming a photoresist layer on the second semiconductor thin film,
    exposing and developing the photoresist layer to form a first photoresist pattern and a second photoresist pattern, the first photoresist pattern corresponding to a position where the first active layer is located, the second photoresist pattern corresponding to positions where the central area and the first doped region are located,
    etching the second semiconductor thin film to form the first active layer and a second semiconductor pattern and expose a portion of the first semiconductor pattern, the second semiconductor pattern corresponding to positions where the central area and the first doped region are located, and
    doping the portion of the first semiconductor pattern exposed to form the second doped region.

2. The manufacturing method according to claim 1, wherein the performing a second doping process to the first semiconductor pattern including the second doped region to form the first doped region comprises:
    performing an ashing treatment to the second photoresist pattern to form a third photoresist pattern, the third photoresist pattern corresponding to a position where the central area is located, and
    doping the first semiconductor pattern a second time to form the first doped region.

3. The manufacturing method according to claim 2, further comprising:
    removing the third photoresist pattern after forming the first doped region.

4. The manufacturing method according to claim 1, wherein the forming the first active layer and the doped regions of the second active layer using the single mask comprises:
    forming a second semiconductor thin film, the second semiconductor thin film covering the first semiconductor pattern,
    forming a photoresist layer on the second semiconductor thin film,
    exposing and developing the photoresist layer to form a first photoresist pattern and a second photoresist pattern, the first photoresist pattern corresponding to a position where the first active layer is located, the second photoresist pattern corresponding to a position where the central area is located,
    etching the second semiconductor thin film to form the first active layer and a second semiconductor pattern and expose a portion of the first semiconductor pattern, the second semiconductor pattern corresponding to a position where the central area is located,
    doping the portion of the first semiconductor pattern exposed to form the doped regions, and
    removing the first photoresist pattern and the second photoresist pattern.

5. The manufacturing method according to claim 4, further comprising:
    after the forming the first active layer and the doped regions of the second active layer using the single mask, forming a first source/drain pattern on the first active layer, and forming a second source/drain pattern on the doped regions,
    depositing a first insulating layer and a resin layer on the first source/drain pattern and the second source/drain pattern, and
    patterning the first insulating layer and the resin layer to form a first through hole at a position corresponding to the first source/drain pattern in the first insulating layer and the resin layer, and form a second through hole at a position corresponding to the second semiconductor pattern in the first insulating layer and the resin layer to expose the second semiconductor pattern.

6. The manufacturing method according to claim 5, further comprising: after the forming the first through hole and the second through hole, forming a common electrode and removing the second semiconductor pattern.

7. The manufacturing method according to claim 6, wherein the forming the common electrode and removing the second semiconductor pattern comprises:
    depositing a common electrode material on the resin layer, and performing a patterning process to the common electrode material and the second semiconductor pattern on the central area to form the common electrode and remove the second semiconductor pattern.

8. The manufacturing method according to claim 1, wherein a material of the first active layer comprises a metal oxide, and a material of the second active layer comprises polysilicon.

9. A manufacturing method of a display substrate, comprising:
    providing a substrate; and
    forming, on the substrate, a first thin film transistor including a first active layer and a second thin film transistor including a second active layer,
    wherein the second active layer includes a central area and doped regions located at two sides of the central area, respectively,
    wherein the forming, on the substrate, of the first thin film transistor including the first active layer and the second thin film transistor including the second active layer comprises: forming the first active layer and the doped regions using a single mask,
    wherein the manufacturing method further comprises forming a first semiconductor pattern prior to the forming the first active layer and the doped regions of the second active layer using the single mask, wherein the doped regions of the second active layer are formed by doping the first semiconductor pattern, wherein the doped regions include a first doped region and a second doped region, and the first doped region is located between the second doped region and the central area, and wherein the forming the first active layer and the doped regions using the single mask comprises:

performing a first doping process to the first semiconductor pattern to form the second doped region, and performing a second doping process to the first semiconductor pattern including the second doped region to form the first doped region, wherein the manufacturing method further comprises:

after the forming the first active layer and the doped regions using the single mask, forming a first source/drain pattern over the first active layer, and forming a second source/drain pattern over the second doped region, depositing a first insulating layer and a resin layer on the first source/drain pattern and the second source/drain pattern, and patterning the first insulating layer and the resin layer, to form a first through hole at a position corresponding to the first source/drain pattern in the first insulating layer and the resin layer, and form a second through hole at a position corresponding to the second semiconductor pattern in the first insulating layer and the resin layer to expose the second semiconductor pattern.

10. The manufacturing method according to claim 9, further comprising after the forming the first through hole and the second through hole, forming a common electrode and removing the second semiconductor pattern.

11. The manufacturing method according to claim 10, wherein the forming the common electrode and removing the second semiconductor pattern comprises:

depositing a common electrode material on the resin layer, and performing a patterning process to the common electrode material and the second semiconductor pattern on the central area and the first doped region to form the common electrode and remove the second semiconductor pattern.

12. A display substrate comprising:

a substrate, and a first thin film transistor and a second thin film transistor on the substrate, the first thin film transistor including a first active layer, and the second thin film transistor including a second active layer, wherein the second active layer includes a central area and doped regions located at two sides of the central area, respectively, wherein the first active layer and the doped regions are formed by using a single mask, wherein the first active layer is made of a metal oxide active layer and the second active layer is made of a polysilicon active layer.

13. The display substrate according to claim 12, wherein the doped region includes a first doped region and a second doped region, the first doped region being located between the second doped region and the central area.

14. The display substrate according to claim 13, wherein the second thin film transistor further includes a second source/drain pattern, the second source/drain pattern covering the second doped region.

15. The display substrate according to claim 12, wherein the display substrate includes a display area and a peripheral area around the display area, the first thin film transistor is located in the display area, and the second thin film transistor is located in the peripheral area.

16. A display device, comprising the display substrate according to claim 12.

* * * * *